(12) United States Patent
Balakrishnan et al.

(10) Patent No.: US 9,627,536 B2
(45) Date of Patent: Apr. 18, 2017

(54) FIELD EFFECT TRANSISTORS WITH STRAINED CHANNEL FEATURES

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Busines Machines Corporation, Armonk, NY (US)

( * ) Notice: Subject to any disclaimer, the term of this patent is extended or adjusted under 35 U.S.C. 154(b) by 22 days.

(21) Appl. No.: 14/749,827

(22) Filed: Jun. 25, 2015

(65) Prior Publication Data

US 2016/0380094 A1 Dec. 29, 2016

(51) Int. Cl.
*H01L 29/78* (2006.01)
*H01L 21/02* (2006.01)
*H01L 29/66* (2006.01)
*H01L 29/06* (2006.01)
*H01L 29/10* (2006.01)
*H01L 29/165* (2006.01)

(52) U.S. Cl.
CPC ...... *H01L 29/785* (2013.01); *H01L 21/02381* (2013.01); *H01L 21/02532* (2013.01); *H01L 29/0649* (2013.01); *H01L 29/1054* (2013.01); *H01L 29/165* (2013.01); *H01L 29/66795* (2013.01)

(58) Field of Classification Search
CPC ............. H01L 29/785; H01L 21/02381; H01L 21/02532; H01L 29/0649; H01L 29/1054; H01L 29/165; H01L 29/66795

USPC .......................................................... 257/192
See application file for complete search history.

(56) References Cited

U.S. PATENT DOCUMENTS

| | | |
|---|---|---|
| 6,991,998 B2 | 1/2006 | Bedell et al. |
| 7,172,930 B2 | 2/2007 | Adam et al. |
| 7,566,606 B2 | 7/2009 | Currie et al. |
| 7,821,067 B2 | 10/2010 | Thean et al. |
| 7,888,197 B2 | 2/2011 | Chidambarrao et al. |
| 7,993,998 B2 | 8/2011 | Chen et al. |

(Continued)

OTHER PUBLICATIONS

Bonnevialle et al., "New insights on strained-Si on insulator fabrication by top recrystallization of amorphized SiGe on SOI", Proc. 2015 Joint International EUROSOI Workshop and International Conference on Ultimate Integration on Silicon (EUROSOI-ULIS), pp. 177-180 (2015).

(Continued)

*Primary Examiner* — Fernando L Toledo
*Assistant Examiner* — Adam S Bowen
(74) *Attorney, Agent, or Firm* — Louis J. Percello, Esq.; Otterstedt, Ellenbogen & Kammer, LLP

(57) ABSTRACT

A method is provided for forming an integrated circuit. A doped silicon layer is formed on a silicon substrate. A silicon-germanium layer is subsequently formed on the doped silicon layer. The silicon-germanium layer is pattered to form a silicon-germanium feature. A silicon shell is formed on the silicon-germanium feature. At least a portion of the dopes silicon layer is converted to a porous silicon layer. Following the last step, the silicon shell is tensily stressed, making it a good candidate for use as a channel feature in an n-type field effect transistor.

18 Claims, 5 Drawing Sheets

(56) References Cited

U.S. PATENT DOCUMENTS

| | | | |
|---|---|---|---|
| 8,466,500 B2 | 6/2013 | Zhu et al. | |
| 8,486,776 B2 | 7/2013 | Bedell et al. | |
| 8,617,968 B1 | 12/2013 | Cheng et al. | |
| 8,895,381 B1 | 11/2014 | Cheng et al. | |
| 2005/0037599 A1* | 2/2005 | Halimaoui | H01L 21/02381 438/510 |
| 2011/0147847 A1* | 6/2011 | Cea | H01L 21/76224 257/368 |
| 2015/0021692 A1 | 1/2015 | Boeuf et al. | |

OTHER PUBLICATIONS

Liu et al., "FDSOI CMOS devices featuring dual strained channel and thin BOX extendable to the 10nm node", Proc. 2014 IEEE International Electron Devices Meeting (IEDM), pp. 9-1 to 9-4 (2014).

Schmidt et al., "A Patterning-Based Strain Engineering for Sub-22 nm Node FinFETs", IEEE Electron Device Letters, 35, pp. 300-302 (2014).

Yin et al., "Fully-depleted strained-Si on insulator NMOSFETs without relaxed SiGe buffers", Technical Digest of 2003 IEEE International Electron Devices Meeting (IEDM'03), pp. 3-2.1 to 3-2.4 (2003).

Anonymous, "Method for Epitaxial Growth on Si": IPCOM000213575D Dec. 21, 2011.

Anonymous, "Methods of Dual-Strain Devices on SOI": IPCOM000241041D Mar. 21, 2015.

* cited by examiner

… (for prior art search)

FIELD EFFECT TRANSISTORS WITH STRAINED CHANNEL FEATURES

BACKGROUND

The present invention relates to the electrical, electronic and computer arts, and, more particularly, to methods for forming field effect transistors in integrated circuits.

The inclusion of strained channels in modern metal-oxide-semiconductor field effect transistor (MOSFET) devices holds the promise of increased charge carrier mobilities and transistor device currents. Unfortunately, however, electron mobility and hole mobility benefit from different strain characteristics. The performance of an n-type field effect transistor (NFET) is typically improved if its channel is tensily strained. In contrast, the performance of a p-type field effect transistor (PFET) is typically improved if its channel is compressively strained. These opposite responses to different types of strain have made strain engineering in complementary metal-oxide-semiconductor (CMOS) processing quite challenging.

BRIEF SUMMARY

Embodiments of the invention provide methods for forming tensily strained silicon features suitable for use as channels in NFET devices in a manner that is easily integrated with the formation of compressively strained channel features in PFET devices on the same integrated circuit.

Aspects of the invention are directed to a method for forming an integrated circuit. A doped silicon layer is formed on a silicon substrate. A silicon-germanium layer is subsequently formed on the doped silicon layer. The silicon-germanium layer is patterned to form a silicon-germanium feature. A silicon shell is formed on the silicon-germanium feature. At least a portion of the doped silicon layer is converted to a porous silicon layer.

Additional aspects of the invention are directed to an integrated circuit formed using a method comprising the steps set forth in the previous paragraph.

Even additional aspects of the invention are directed to an integrated circuit comprising an oxide layer, a silicon-germanium feature, and a silicon shell. The silicon-germanium feature is disposed on the oxide layer. The silicon shell is disposed on the silicon-germanium feature. The silicon shell is tensily strained.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

Figure 1:
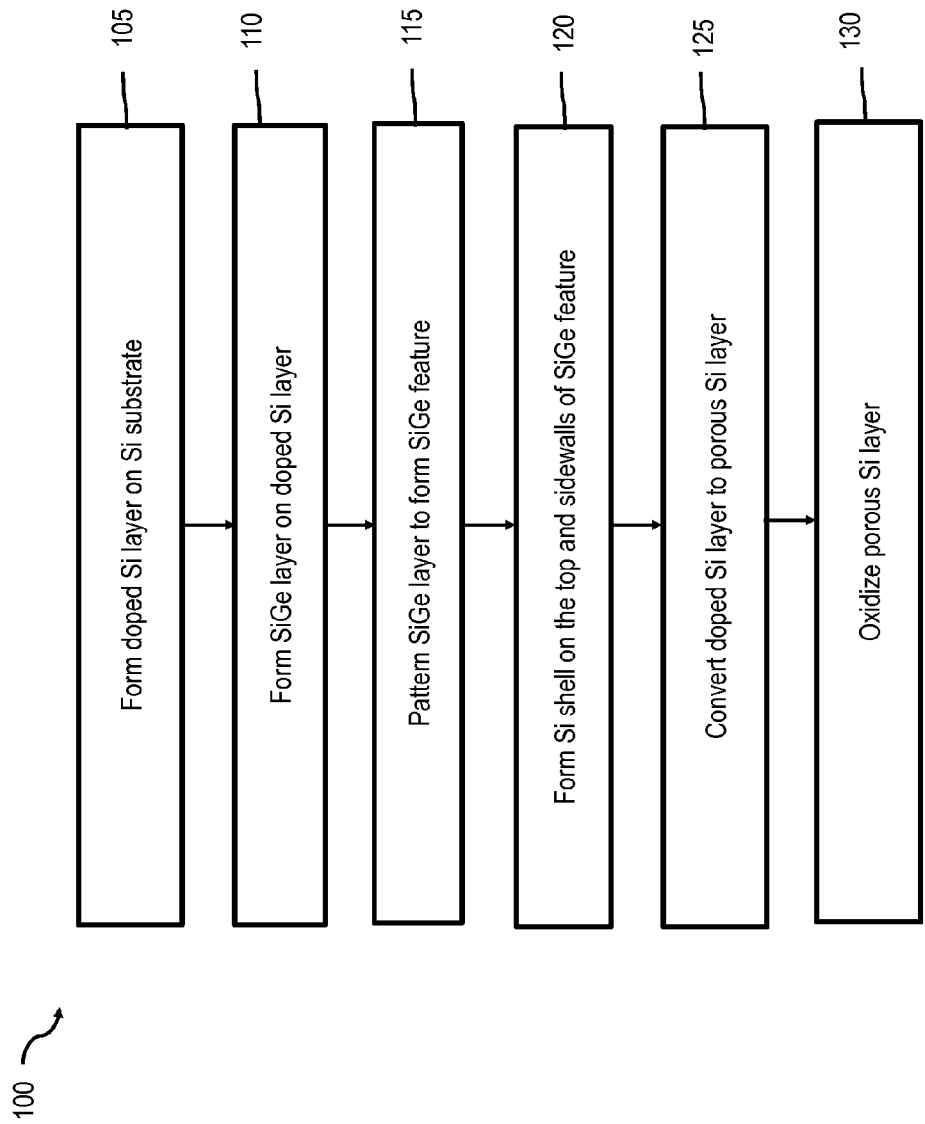
FIG. 1 shows a flow diagram of a method for forming a base structure of an integrated circuit, in accordance with an illustrative embodiment of the invention.

FIG. 1 shows a flow diagram of a method 100 in accordance with an illustrative embodiment of the invention for forming a base structure for an NFET in a CMOS integrated circuit. FIGS. 2-7, in turn, show sectional views of intermediate film stacks formed during the processing. Although the method 100 and the structures formed thereby are entirely novel, the individual processing steps required to implement the method 100 may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, S. Wolf and R. N. Tauber, *Silicon Processing for the VLSI Era, Volume 1*, Lattice Press, 1986; S. Wolf, *Silicon Processing for the VLSI Era, Vol. 4: Deep-Submicron Process Technology*, Lattice Press, 2003; and S. M. Sze, *VLSI Technology, Second Edition*, McGraw-Hill, 1988, all of which are incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However one skilled in the art will readily recognize those processing steps omitted from this more generalized description.

Figure 2:
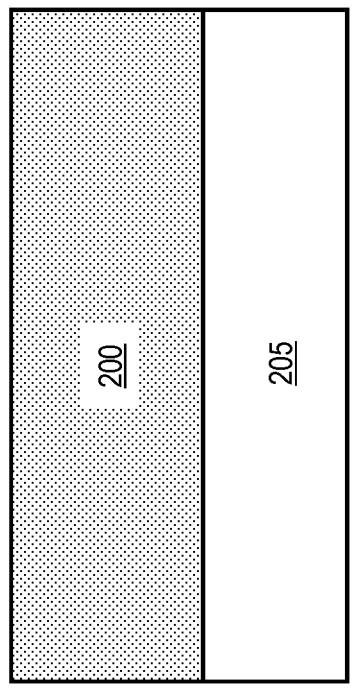

The method 100 starts in step 105 with the formation of a doped silicon layer 200 (doped Si) on a silicon substrate 205 (Si substrate). The silicon substrate 205 may be in the form of a silicon wafer. In the present illustrative embodiment, boron is used as the dopant to make the doped silicon layer 200 p-type. The doped silicon layer 200 may be formed, by for example, boron ion implantation into the surface region of the silicon substrate 205, followed by annealing to diffuse and activate the dopant. Preferably, the dopant concentration in the doped silicon layer 200 is between $1E19/cm^3$ to $1E21/cm^3$. The resultant film stack is shown in FIG. 2. In another embodiment, the doped silicon layer 200 can be formed by epitaxially growing silicon with in-situ boron doping instead of by ion implantation/annealing. This epitaxial growth may be integrated with the subsequent epitaxy of silicon-germanium if so desired (see next paragraph).

Figure 3:
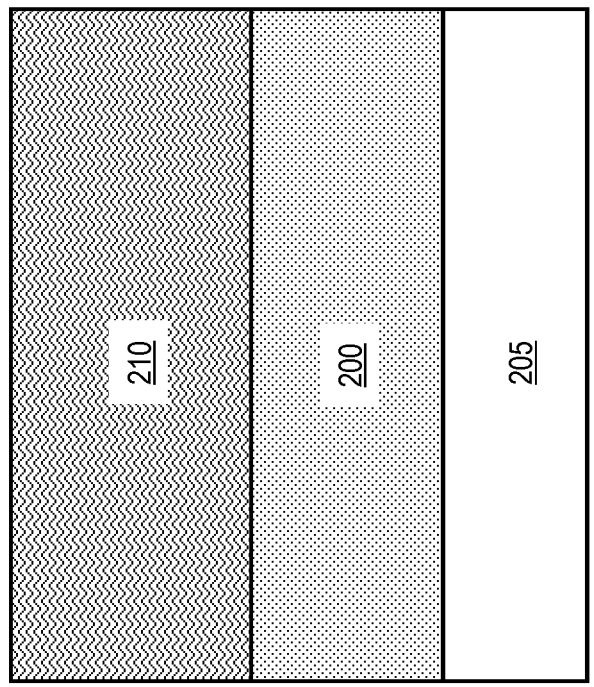
FIGS. 2-7 show sectional views of intermediate film stacks formed when performing the FIG. 1 method.

Subsequently, in step 110, a silicon-germanium layer 210 (SiGe layer) is formed on the doped silicon layer 200 to yield the film stack shown in FIG. 3. Deposition may be by vapor-phase epitaxial growth in either a multi-wafer or a single-wafer reactor. When using a multi-wafer reactor, any native oxide on the surface of the doped silicon layer 200 may be initially removed by dipping the wafer in diluted hydrofluoric acid. In addition to removing the native oxide, this wet etch also acts to terminate the surface of the wafer in hydrogen. The wafer may then be introduced into the multi-wafer reactor, where it is exposed to silane, germanium, and hydrogen in the milli-torr total pressure range and at about 500-700° C. Single-wafer processing may be performed in a single-wafer reactor with similar processing parameters, but the wet etch to remove the native oxide may be replaced by an in-situ high temperature anneal by rapid thermal processing (RTP) to sublimate that oxide. Single-wafer reactors capable of depositing silicon-germanium are available from, for example, Applied Materials (Santa Clara, Calif., USA). Optionally, an additional silicon layer (not shown) may be grown on top of the silicon-germanium layer 210. The optional additional silicon layer, if present, can be used to facilitate the forming of a silicon shell in later processing (see step 120 below).

Because germanium is larger than silicon, the incorporation of germanium into the silicon-germanium layer 210 creates a lattice mismatch between that layer and the underlying doped silicon layer 200. This mismatch causes the silicon-germanium layer 210 to be compressively strained. The amount of this strain may be modulated somewhat by incorporating greater or smaller atomic percentages of germanium into the silicon-germanium layer 210, as well as by varying that percentage over the thickness of the silicon-germanium layer 210. In one or more embodiments in accordance with aspects of the invention, the silicon-germanium layer 210 may be characterized by a straight or graded germanium concentration profile with a germanium concentration maintained in the 10-40 atomic percent range, although this range is meant to be purely illustrative and is not intended to limit the scope of the invention.

In step 115, the silicon-germanium layer 210 is patterned to form a silicon-germanium feature 215. Here, processing may be accomplished by, for example, lithography followed by reactive-ion etching (RIE). The RIE of the silicon-germanium layer 210 to define the silicon-germanium feature 215 is preferably somewhat selective to the doped silicon layer 200, meaning that it etches the silicon-germanium layer 210 faster than the doped silicon layer 200. This allows the RIE process to be easily stopped on the doped silicon layer 200 to yield the film stack shown in FIG. 4. Suitable RIE chemistries may include, for example, carbon tetrafluoride ($CF_4$) with argon because germanium normally has a higher chemical etching characteristic with fluorine than does silicon, thus allowing some selectivity in the etch. The etch rate of silicon-germanium relative to silicon in carbon tetrafluoride may typically be increased by increasing carbon tetrafluoride concentrations, increasing total pressure, and decreasing plasma power.

Figure 5:
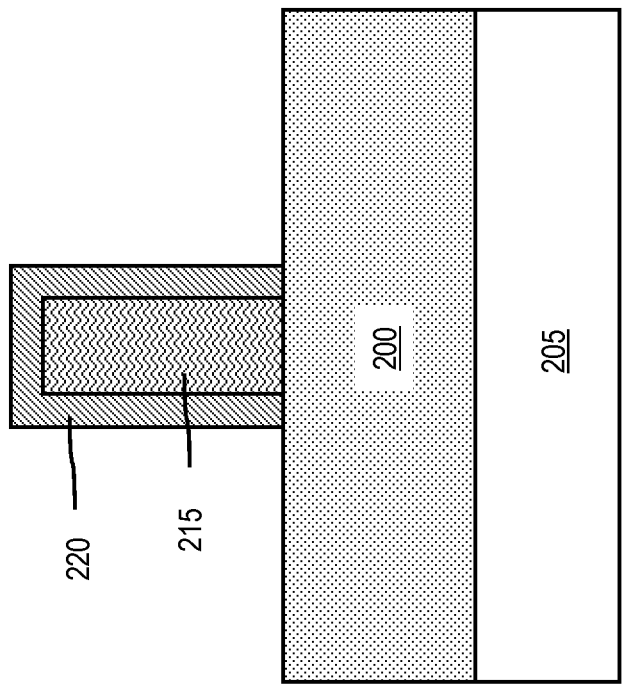
Figure 4:
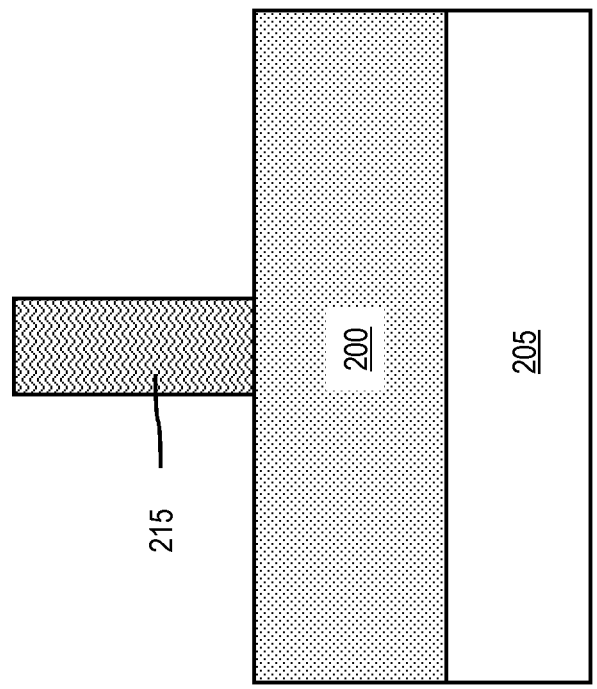

With the silicon-germanium feature 215 formed as shown in FIG. 4, the method 100 then proceeds to step 120, wherein a silicon shell 220 is formed on the top and sidewalls of the silicon-germanium feature 215. The result of this processing is shown in FIG. 5. Here, processing may occur by depositing a silicon layer by silicon epitaxy at elevated temperature (e.g., above 600° C.) utilizing a gaseous source of silicon (e.g., silane, silicon tetrachloride, dichlorosilane), and hydrogen as gaseous reactants. In one embodiment, the silicon epitaxy process is tuned to grow at a much faster rate on exposed silicon-germanium than on boron-doped silicon. Epitaxy followed by etch back may be performed to remove any silicon deposited on the top of the doped silicon layer 200. In another embodiment, the silicon layer is deposited around the silicon-germanium feature 215 as well as on the top of the doped silicon layer 200. A RIE process is then used to remove the just-deposited silicon layer from the top of the doped silicon layer 200. To ensure that silicon remains on top of the silicon-germanium feature 215 after RIE, the additional silicon layer set forth above may be epitaxially grown on top of the silicon-germanium layer 210 in step 110.

Figure 6B:
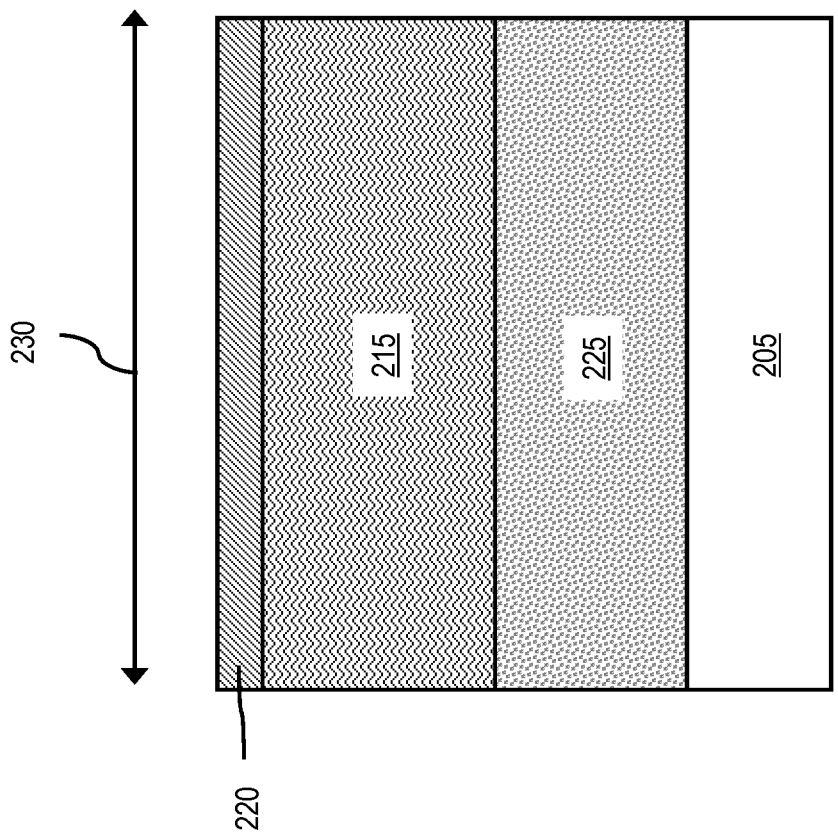
Figure 6A:
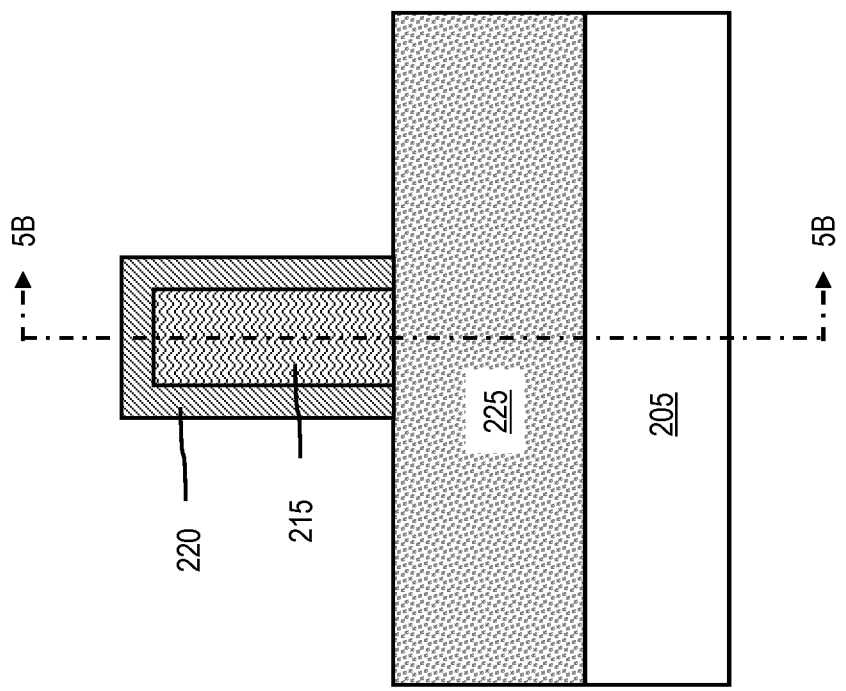

Step 125 of the method 100 involves converting the doped silicon layer 200 to a porous silicon layer 225, yielding the film stack shown in FIGS. 6A and 6B (where FIG. 6B shows a second sectional view of the film stack along the plane indicated in FIG. 6A). In one or more embodiments, an anodization process may be used to perform this conversion. In such a process, an electrical potential is induced in the doped silicon layer by, for example, illumination, while the wafer is immersed in dilute hydrogen fluoride. The anodization process is believed to be dependent on hole concentrations, thus accounting for a preference that the doped silicon layer 200 be doped so as to be p-type when formed during step 105. It is noted however, that, in one or more alternative embodiments, an n-type dopant (e.g., phosphorous) may be utilized in the doped silicon layer 200 in step 105, so long as adequate illumination is provided during anodization in step 125 to produce the required number of holes to drive the conversion to the porous silicon layer 225.

The conversion of the doped silicon layer 200 to the porous silicon layer 225 has a significant effect on the silicon-germanium feature 215 and the overlying silicon shell 220. Porous silicon has a relatively low Young's Modulus when compared to non-porous crystalline silicon. As a result, the porous silicon layer 225, now being somewhat elastic, allows the silicon-germanium feature 215 to stretch in response to the compressive strain that was induced therein during its deposition in step 110. The relaxation of the silicon-germanium feature 215, in turn, stretches the silicon shell 220 and induces a tensile strain in the silicon shell 220. The stretching of the porous silicon layer 225, the silicon-germanium feature 215, and ultimately the silicon shell 220 during step 120 is diagrammatically represented in FIG. 6B by an arrow 230.

Thus, to summarize steps 105-125, a tensily strained silicon shell is formed by first forming a compressively strained silicon-germanium feature on an underlying doped silicon layer and then covering that silicon-germanium feature with silicon. Subsequently, the underlying doped silicon layer is converted to porous silicon, which allows the silicon-germanium feature to relax (i.e., stretch), inducing a tensile strain in the silicon shell. The method 100 thereby becomes a viable method for forming a tensily strained silicon feature on a crystalline silicon substrate.

Figure 7:
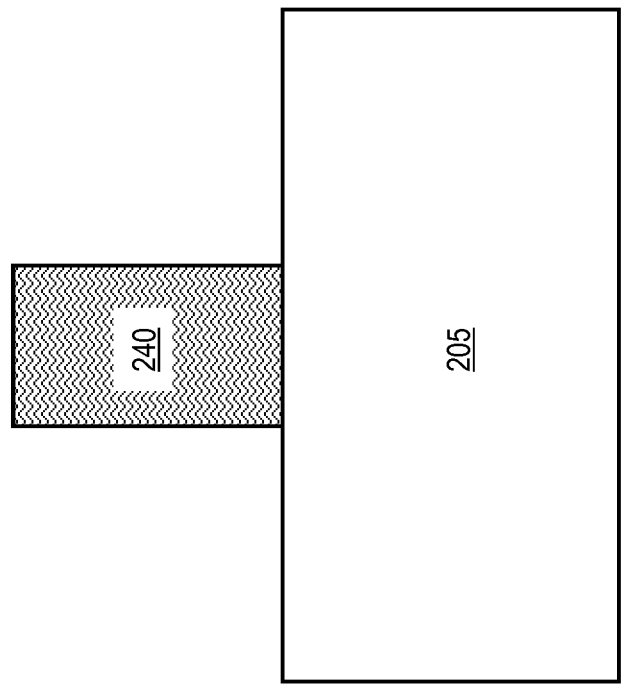

Returning to FIG. 1, in step 130 of the method 100, the porous silicon layer 225 is oxidized to form a silicon dioxide layer 235 in the place of the porous silicon layer 225. Processing may be by a mild thermal oxidation in a water (wet) or oxygen (dry) ambient. Because of the porosity of the porous silicon layer 225, its rate of oxidation will be significantly faster than that of the exposed silicon shell 220. The resultant film stack is shown in FIG. 7.

Figure 8:
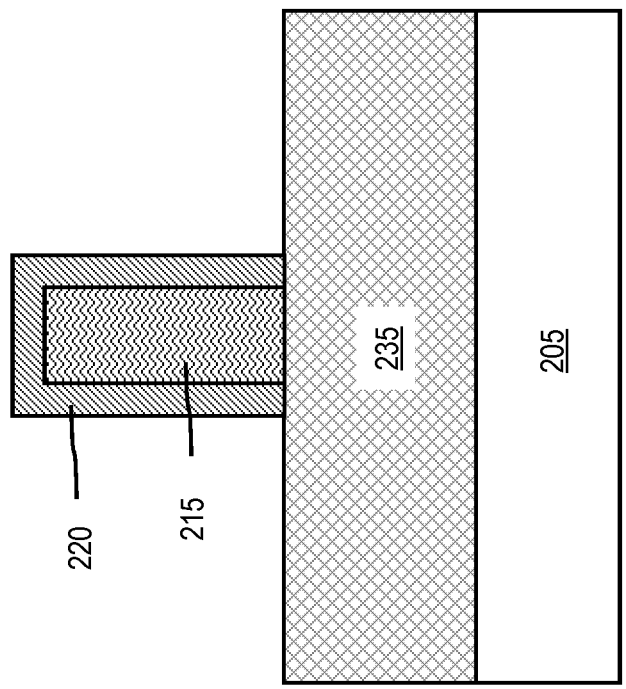
FIG. 8 shows a sectional view of an exemplary PFET base structure that may be integrated into the same integrated circuit as the FIG. 1 base structure.

So formed, the silicon shell 220, now tensily strained, becomes an excellent channel feature for use in an NFET, particularly a FinFET with a gate that is capacitively coupled to three sides of the channel feature. That is, the film stack in FIG. 7 forms an excellent base structure upon which to form NFETs with tensily strained channels by additional CMOS processing. Advantageously, PFETs with compressively strained channels may be formed on the same integrated circuit as these NFETs simply by placing a block mask over the regions of the silicon substrate 205 slated for those PFETs while performing the method 100. FIG. 8 shows an exemplary base structure well suited for a PFET that, through the use of a block mask, may be placed on the same integrated circuit as the base structure shown in FIG. 7. The base structure in FIG. 8 includes the silicon substrate 205 with a patterned, compressively strained silicon-germanium channel feature 240.

It should again be emphasized that the above-described embodiments of the invention are intended to be illustrative only. Other embodiments may, for example, utilize different processing steps from those expressly set forth above to also achieve embodiments falling within the scope of the invention.

The method 100 as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. §112(f). In particular, the use of "steps of" in the claims herein is not intended to invoke the provisions of AIA 35 U.S.C. §112(f).

What is claimed is:

1. A method for forming an integrated circuit comprising the steps of:
    forming a doped silicon layer on a silicon substrate;
    forming a silicon-germanium layer on the doped silicon layer;
    patterning the silicon-germanium layer to form a silicon-germanium feature;
    forming a silicon shell on the silicon-germanium feature; and
    converting at least a portion of the doped silicon layer to a porous silicon layer after forming the silicon shell.

2. The method of claim 1, further comprising the step of oxidizing the porous silicon layer.

3. The method of claim 1, further comprising the step of masking a portion of the silicon substrate before forming the doped silicon layer.

4. The method of claim 1, wherein forming the doped silicon layer comprises ion implantation or epitaxial growth with in-situ doping.

5. The method of claim 1, wherein the doped silicon layer is doped so as to be p-type.

6. The method of claim 1, wherein the silicon-germanium layer is compressively strained.

7. The method of claim 1, further comprising the step of forming an additional silicon layer on the silicon-germanium layer.

8. The method of claim 1, wherein converting at least a portion of the doped silicon layer to the porous silicon layer causes the silicon-germanium layer to stretch.

9. The method of claim 1, wherein the silicon shell is tensily strained after converting at least a portion of the doped silicon layer to the porous silicon layer.

10. The method of claim 1, wherein converting at least a portion of the doped silicon layer to the porous silicon layer comprises anodization in diluted hydrofluoric acid.

11. An integrated circuit comprising:
    a doped silicon layer formed on a silicon substrate;
    a silicon-germanium layer formed on the doped silicon layer;
    a silicon-germanium feature formed from the silicon-germanium layer during a patterning process;
    a silicon shell formed on the silicon-germanium feature; and
    a porous silicon layer converted from at least a portion of the doped silicon layer in a manner which is configured to tensily strain the silicon shell.

12. The integrated circuit of claim 11, wherein the silicon shell forms a channel of an n-type field effect transistor.

13. The integrated circuit of claim 11, wherein the silicon-germanium layer is compressively strained.

14. The integrated circuit of claim 11, wherein the silicon shell is tensily strained after converting at least a portion of the doped silicon layer to the porous silicon layer.

15. The integrated circuit of claim 11, wherein the silicon shell forms a channel of a FinFET.

16. The integrated circuit of claim 11, wherein the integrated circuit comprises a p-type field effect transistor with a channel comprising silicon-germanium.

17. The integrated circuit of claim 16, wherein the channel is compressively strained.

18. An integrated circuit comprising:
    an oxide layer;
    a silicon-germanium feature disposed on the oxide layer;
    a silicon shell disposed on the silicon-germanium feature, the silicon shell being tensily strained, the silicon shell forming a channel in an n-type field effect transistor; and
    a p-type field effect transistor comprising a silicon-germanium channel that is compressively strained.

* * * * *